(12) United States Patent
Lu et al.

(10) Patent No.: US 7,411,452 B2
(45) Date of Patent: Aug. 12, 2008

(54) LOW DC POWER RAIL-TO-RAIL BUFFER AMPLIFIER FOR LIQUID CRYSTAL DISPLAY APPLICATION

(75) Inventors: Chih-Wen Lu, Jhumen Village (TW); Peter H. Xiao, Belmont, CA (US)

(73) Assignee: New Vision Micro Inc., Tortola (VG)

( * ) Notice: Subject to any disclaimer, the term of this patent is extended or adjusted under 35 U.S.C. 154(b) by 88 days.

(21) Appl. No.: 11/559,395

(22) Filed: Nov. 13, 2006

(65) Prior Publication Data

US 2007/0126506 A1    Jun. 7, 2007

Related U.S. Application Data

(60) Provisional application No. 60/748,482, filed on Dec. 7, 2005.

(51) Int. Cl.
*H03F 3/45* (2006.01)

(52) U.S. Cl. ..................... 330/253; 330/261

(58) Field of Classification Search .............. 330/253, 330/255, 257, 261
See application file for complete search history.

(56) References Cited

U.S. PATENT DOCUMENTS

| | | | | |
|---|---|---|---|---|
| 4,797,631 | A * | 1/1989 | Hsu et al. | 330/253 |
| 6,778,014 | B2 * | 8/2004 | Rennig | 330/253 |
| 7,310,017 | B2 * | 12/2007 | Etou | 330/253 |
| 7,315,210 | B2 * | 1/2008 | Nguyen | 330/253 |

* cited by examiner

*Primary Examiner*—Henry K Choe
(74) *Attorney, Agent, or Firm*—Aaron Wininger; Thelen Reid Brown Raysman & Steiner

(57) ABSTRACT

A low DC power rail-to-rail buffer amplifier is suitable for liquid crystal display application. The buffer amplifier comprises: a dc bias stage, a pair of complementary differential amplifiers, a second stage amplifier, and output stage. The dc bias stage is used for the dc bias of the differential amplifiers and the second stage to obtain a rail-to-rail operation. This buffer amplifier can be operated in the power supply ranges of 5.5 V to the breakdown voltage. Simulated results show that the circuit draws only 5.3 μA static current.

12 Claims, 6 Drawing Sheets

Bias Circuit                    Buffer Cell

LOW DC POWER RAIL-TO-RAIL BUFFER AMPLIFIER FOR LIQUID CRYSTAL DISPLAY APPLICATION

PRIORITY REFERENCE TO PRIOR APPLICATIONS

This application claims benefit of and incorporates by reference U.S. patent application No. 60/748,482, entitled "Low DC Power Rail-To-Rail Buffer Amplifier For Liquid Crystal Display Application," filed on Dec. 7, 2005, by inventors Chih-Wen LU et al.

TECHNICAL FIELD

This invention relates generally to liquid crystal displays, and more particularly, but not exclusively, provides a buffer amplifier for use in a liquid crystal display.

BACKGROUND

With the evolution of compact, light-weight, low-power and high quality displays, there is a large demand to develop a low-power dissipation, high-speed, high resolution and large output swing Liquid-Crystal Display (LCD) driver. An LCD driver is generally composed of column drivers, gate drivers, a controller, and a reference source. The column drivers are especially important for achieving high-speed driving, high resolution, low-power dissipation and large output swing. A column driver generally includes registers, data latches, digital-to-analog converters (DAC's) and output buffers. Among those, the output buffers determine the speed, resolution, voltage swing and power dissipation of the column drivers. Due to the thousands of output buffer amplifiers built into a single chip, the buffer should occupy a small die area, and its static power consumption should be small. The output buffer should offer an almost rail-to-rail voltage driving which can accommodate higher gray levels. Also, the settling time should be smaller than the horizontal scanning time. For a UXGA (1600×1200) display, the pixel clock frequency is 162 MHz and its horizontal scanning time is only 9.877 μs.

SUMMARY

An embodiment of the invention comprises a low DC power rail-to-rail buffer amplifier, which is suitable for liquid crystal display application. The buffer amplifier comprises: a dc bias stage, a pair of complementary differential amplifiers, a second stage amplifier, and output stage. The DC bias stage is used for the DC bias of the differential amplifiers and the second stage to obtain a rail-to-rail operation.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
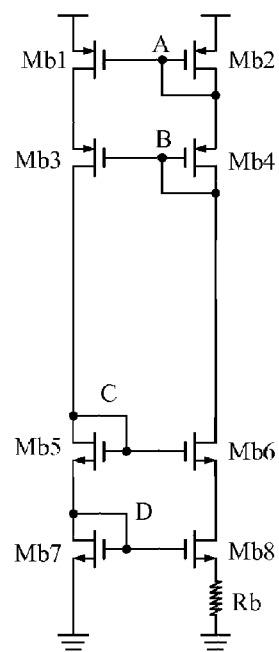
FIG. 1 is a circuit diagram illustrating a low DC power rail-to-rail buffer amplifier according to an embodiment of the invention.
Figure 1:
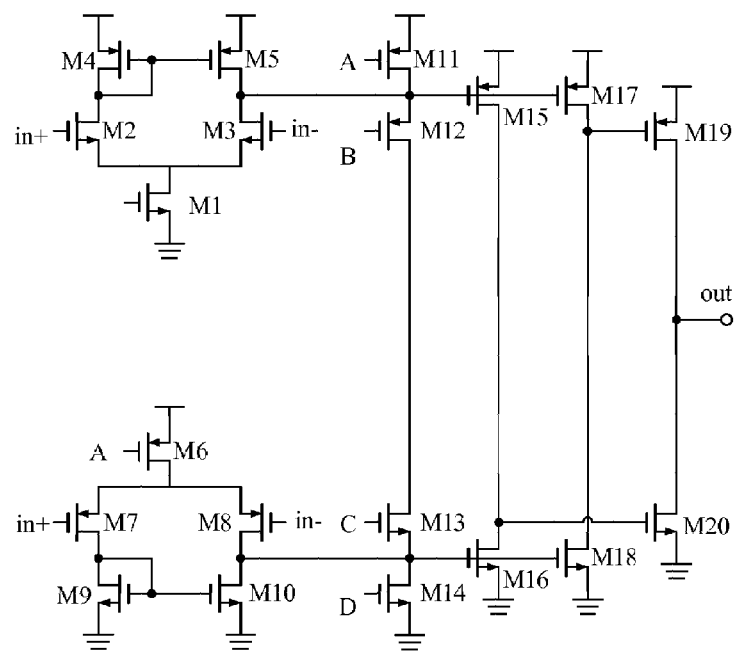

FIG. 1 is a circuit diagram illustrating a low dc power rail-to-rail buffer amplifier 100 according to an embodiment of the invention. The amplifier 100 comprises a DC bias stage (Mb1~Mb8 and Rb), a pair of complementary differential amplifiers (M1~M10), a second stage amplifier (M11~M18), and an output stage (M19 and M20). As a buffer, "out" is connected to the inverting input (in−) and the input signal is applied to the non-inverting terminal (in+). The column line is connected to the output, "out".

The differential pairs M2~M3 and M7~M8, which are biased by the constant current sources M1 and M6, are actively loaded by the current mirror formed by M4~M5 and M9~M10. The differential pairs are designed to have the same bias current. Hence, the ratio between the aspect ratio of M1 to that of Mb7 should be equal to the ratio between the W/L of M6 to that of Mb2.

The second stage is used to amplify the voltage difference of two inputs. The transistors M11~M14 are used to bias the second stage to obtain a rail-to-rail operation. Without these bias transistors, the transistors M16 and M18 will be cut off for a higher input voltage. M15 and M17 will be also cut off for a lower input voltage. However, in an embodiment of the invention, the second stage can operate under a rail-to-rail input. In the stable state, the current in M11~M14 is only mirrored from the dc bias stage. The currents of the differential amplifiers do not flow into M11~M14 no matter what value of the input common mode voltage is. The gate voltage of M16 and M18 is equal to that of Mb7. Also, the gate voltage of M15 and M17 is equal to that of Mb2. Hence, the currents in M15~M18 are well defined. In order to cut off the output transistors M19 and M20 to reduce the dc power dissipation in the stable state, the aspect ratios of M15~M18 are chosen as:

$$\left(\frac{W}{L}\right)_{15} = \left(\frac{W}{L}\right)_{b2} - \Delta\left(\frac{W}{L}\right) \tag{1}$$

-continued $$\left(\frac{W}{L}\right)_{16} = \left(\frac{W}{L}\right)_{b7} + \Delta\left(\frac{W}{L}\right) \quad (2)$$

$$\left(\frac{W}{L}\right)_{17} = \left(\frac{W}{L}\right)_{b2} + \Delta\left(\frac{W}{L}\right) \quad (3)$$

$$\left(\frac{W}{L}\right)_{18} = \left(\frac{W}{L}\right)_{b7} - \Delta\left(\frac{W}{L}\right) \quad (4)$$

Since the size of M15 is smaller than that of Mb2 and the aspect ratio of M16 is larger than that of Mb7, the transistor M16 will get into the triode region and the drain-to-source voltage of M16 will be reduced to a small value. This will make the output transistor M20 be in the cut off region. Similarly, M17 will also be in the triode region and the output transistor M19 will be cut off. Hence, the output transistors consume no dc power.

When the input voltage, in+, is increased, the gate voltages of M15~M18 will be increased. As a result, M16 will be still in the triode region while M17 will go into the saturation region. The drain voltage of M17 will decrease to turn on M19. Then M19 starts to charge the output node. However, M20 is still in the cut off region. When the output voltage reaches the level that the voltage difference between the input and output is almost zero, M19 stops charging the output node. Since the gate voltage of M19 can be pulled down to a very low level, M19 can be turned to fully "on" to charge the output at a maximal speed. Similarly, when the input voltage, in+, is decreased, M19 is still cut off from the output, but the gate voltage of M20 is increased and M20 starts to discharge the output load until the output voltage almost equal to the input voltage. The gate voltage of M20 can reach a value of $V_{DD}$, so M20 can discharge the output load at a maximal speed.

Simulated Results

Figure 2:
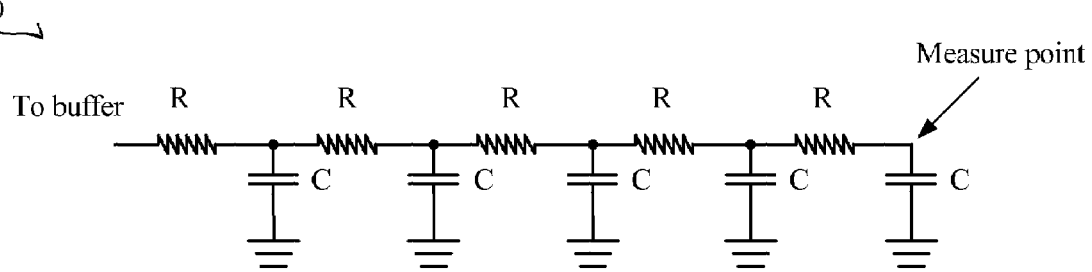
FIG. 2 is a circuit diagram illustrating an equivalent circuit of the column line for the simulation.
Figure 3A:
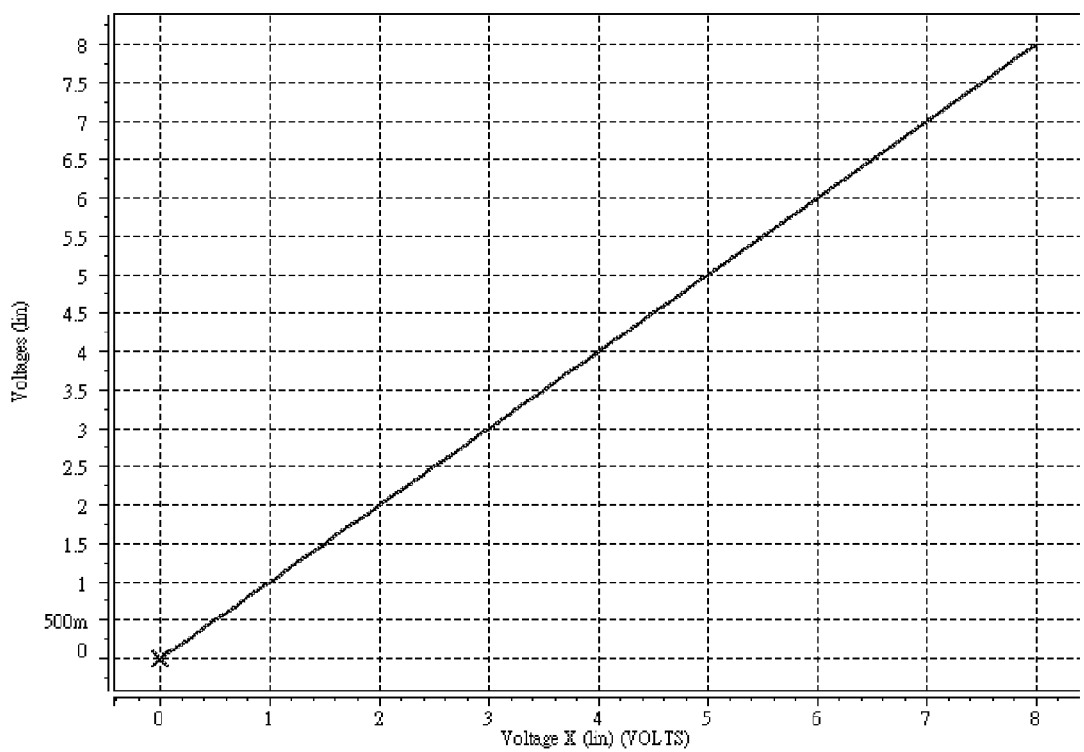
FIG. 3A and FIG. 3B are charts illustrating the dc transfer characteristic of the unit-gain buffer amplifier for power supplies of (a) 8 V and (b) 13.5 V, respectively.
Figure 3B:
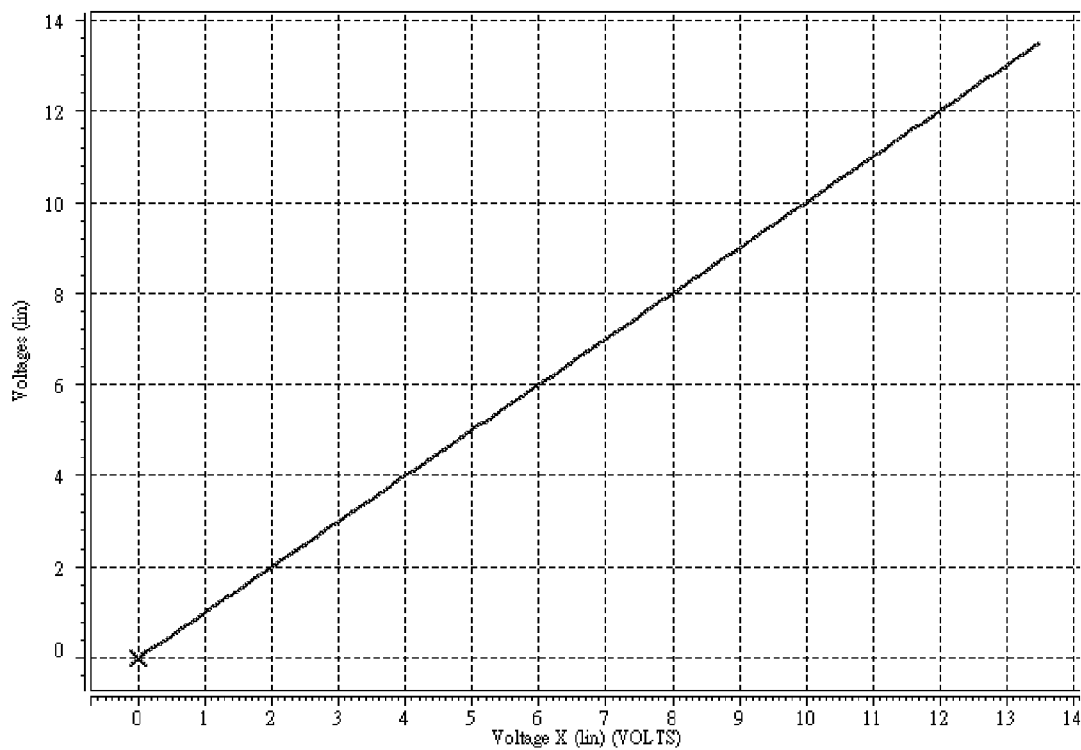
Figure 4A:
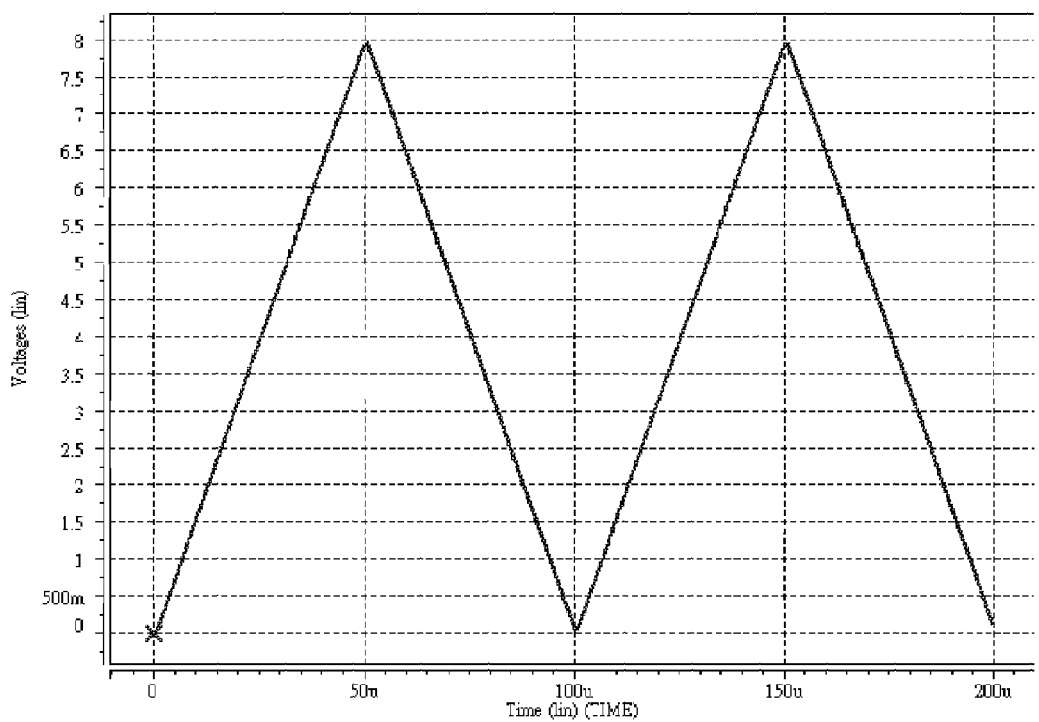
FIG. 4A and FIG. 4B are charts illustrating the simulated dynamic results of the output with the input of a full swing of a 10 KHz triangular wave of the proposed buffer amplifier for the power supplies of (a) 8 V and (b) 13.5 V, respectively.
Figure 4B:
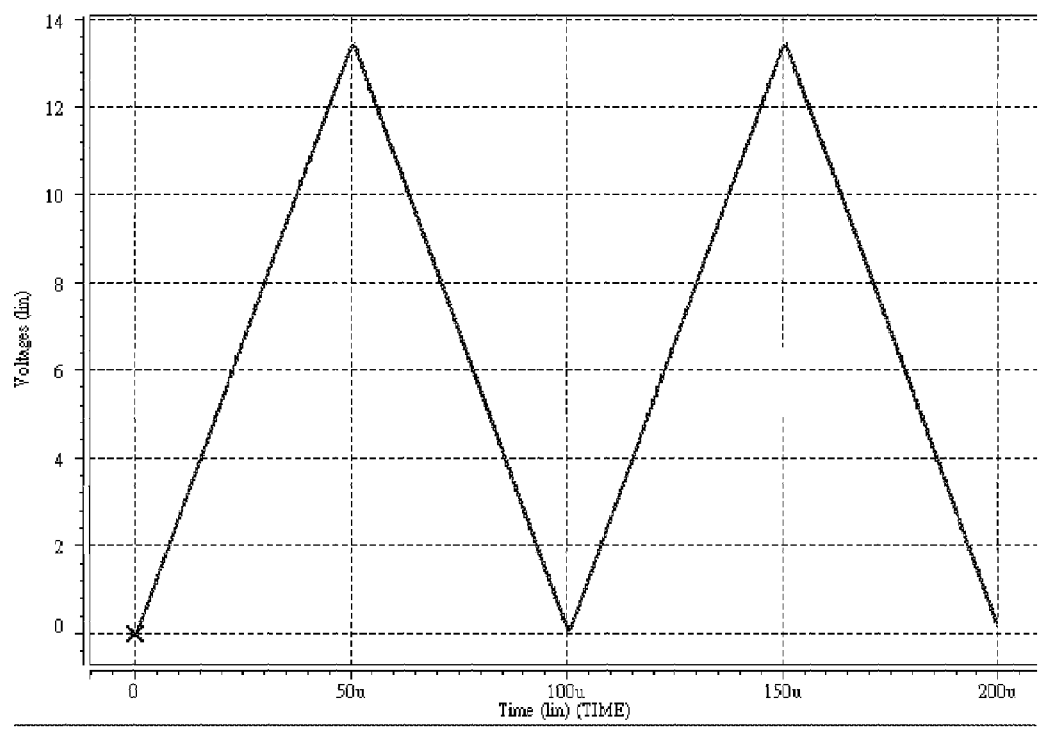
Figure 5A:
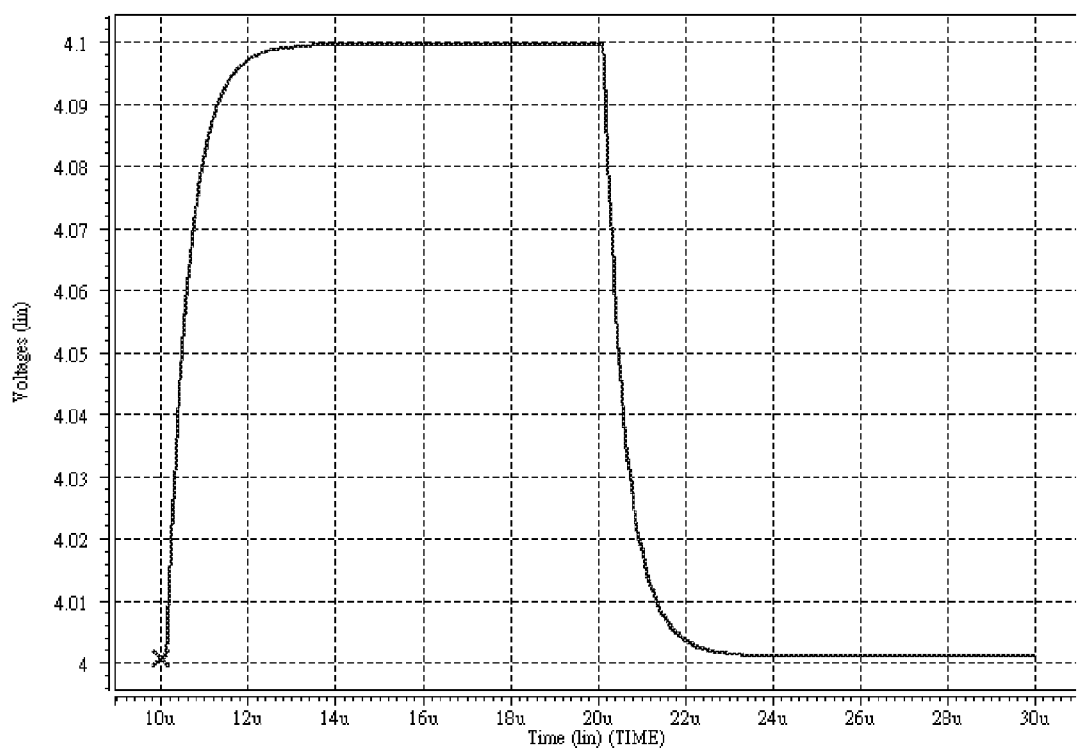
FIG. 5A and FIG. 5B are charts illustrating the step responses of the buffer supplied with (a) 8 V and (b) 13.5 V with the input voltage swing of 10 mV.
Figure 5B:
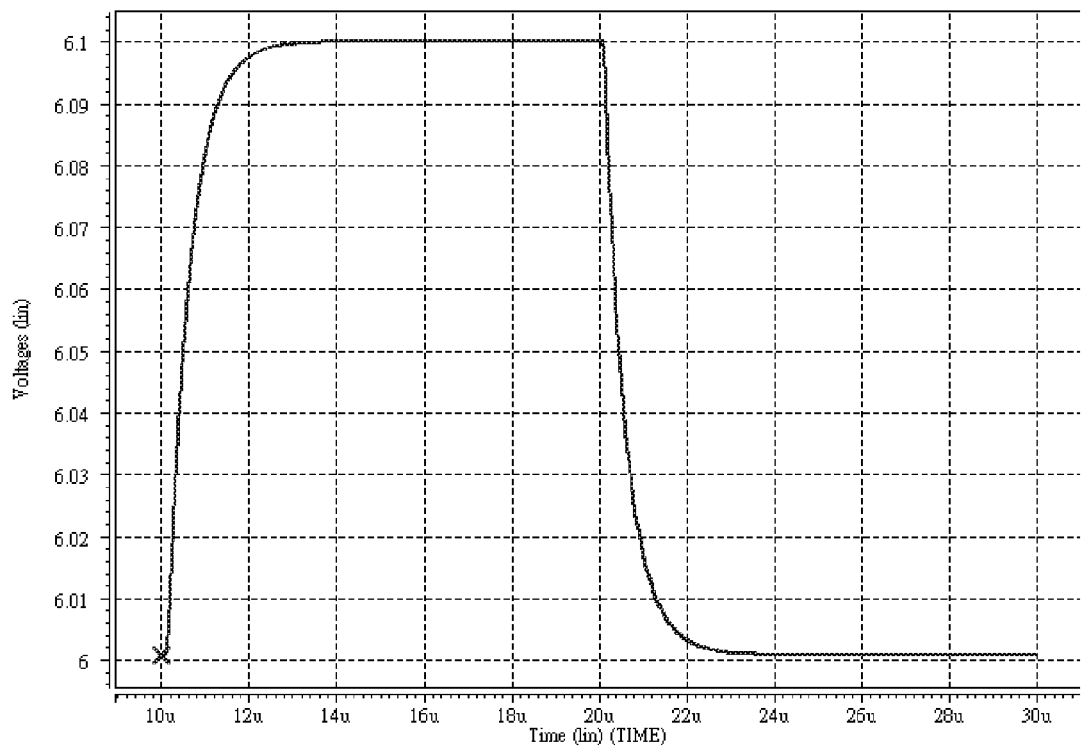
Figure 6A:
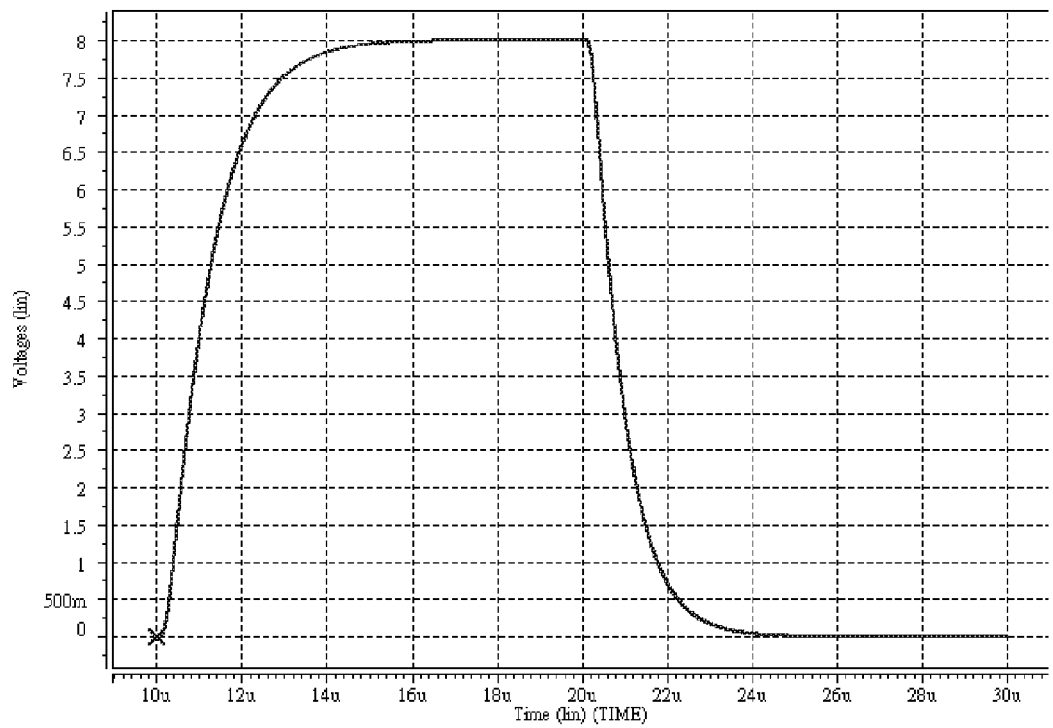
FIG. 6A and FIG. 6B are charts illustrating the step responses of a full swing for (a) 8 V and (b) 13.5 V power supplies.
Figure 6B:
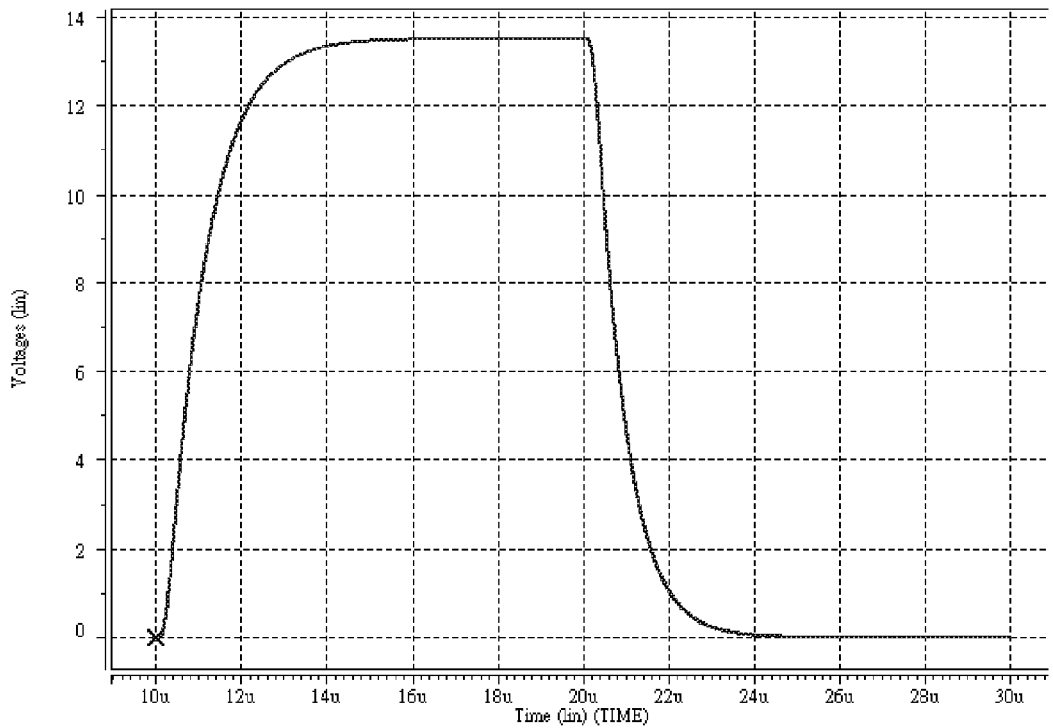

The output buffer amplifier 100 was simulated using a 0.35-μm high-voltage CMOS technology. FIG. 2 shows the equivalent circuit 200 of the column line for the simulation. The values of the resistance and the capacitance are 2 kΩ and 20 pF, respectively. The measured point is at the point of the last stage of RC network. FIGS. 3 (a) and (b) show the dc transfer characteristic of the unit-gain buffer amplifier for power supplies of 8 V and 13.5 V, respectively. These figures show that the circuit 200 is a rail-to-rail buffer amplifier. FIGS. 4 (a) and (b) show the dynamic results of the output with the input of a full swing of a 10 KHz triangular wave of the proposed buffer amplifier for the power supplies of 8 V and 13.5 V, respectively. They can be seen that the output basically follows the input for a full swing. The step responses of the same buffer supplied with 8 V and 13.5 V with the input voltage swing of 10 mV are shown in FIGS. 5 (a) and (b), respectively. They can be seen that the circuit 200 has a good resolution. FIGS. 6 (a) and (b) show the step responses of a full swing for 8 V and 13.5 V power supplies, respectively. The settling times for the output to settle to within ±5 mV of the final voltage for the power supply of 8 V are only 7 μs and 5 μs for the rising and falling edges, respectively, and for 13.5 V power supply are only 7 μs and 5.5 μs for the rising and falling edges, respectively. Table 1 shows the performance summary.

TABLE 1

| | |
|---|---|
| Range of Power Supply | 5.5 V~Breakdown voltage |
| Static Current | 5.3 μA |
| Input Range (VDD = 8 V) | 0~8 V |
| Input Range (VDD = 13.5 V) | 0~13.5 V |
| Settling Time (VDD = 8 V) | 7 μs (rising); 5 μs (falling) |
| Settling Time (VDD = 13.5 V) | 7 μs (rising); 5.5 μs (falling) |

Figure 7:
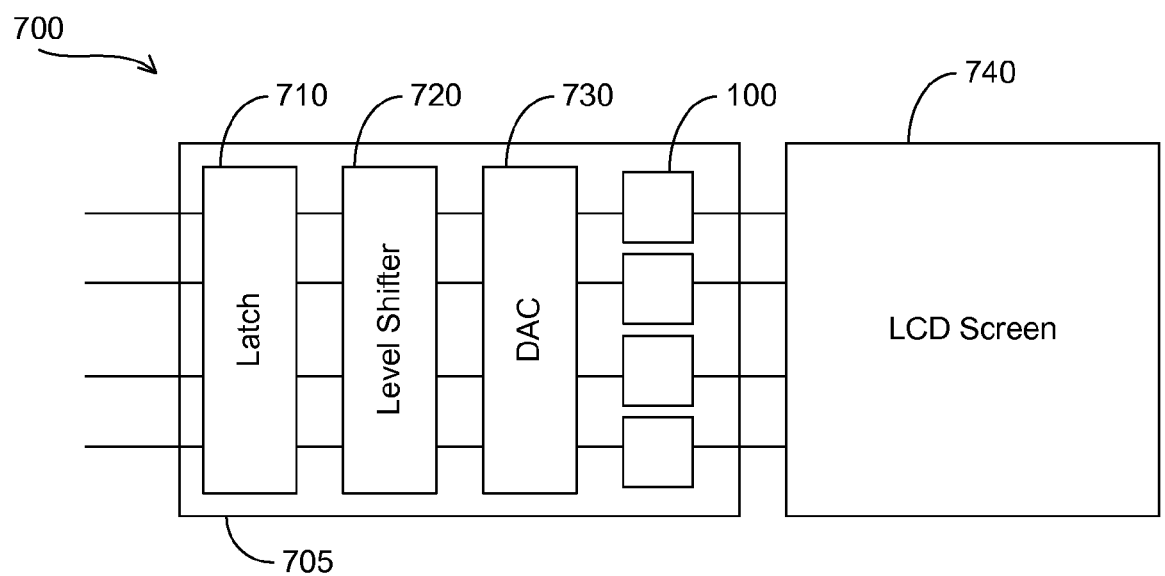
FIG. 7 is a block diagram illustrating a LCD incorporating the buffer amplifier of FIG. 1.

FIG. 7 is a block diagram illustrating a LCD 700 incorporating the buffer amplifier 100. The LCD 700 includes a LCD driver 705 and a LCD screen 740. The driver 705 comprises a latch 710, a level shifter 720, a digital to analog (DAC) 730, and a plurality of buffer amplifiers 100. The latch 710 receives and stores digital signals (e.g., 6 bit) corresponding to an image to be displayed on the screen 740. The latch 710 transmits the signal to the level shifter 720, which ups the signal from 3V to 12V. The DAC 730 then converts the upped signal to an analog signal. The buffers 100, which are coupled to thin film transistors (TFTs) on source lines of the screen 740, drive the TFTs.

The foregoing description of the illustrated embodiments of the present invention is by way of example only, and other variations and modifications of the above-described embodiments and methods are possible in light of the foregoing teaching. For example, the buffer amplifier 100 can be used for other applications besides LCDs. Further, components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A buffer amplifier, comprising:
a DC bias stage;
two complementary differential amplifiers;
a second stage amplifier coupled to the pair of complementary differential amplifiers and the DC bias stage; and
an output stage coupled to the second stage amplifier;
wherein the second stage amplifier comprises
a first set of bias transistors, M11 and M12;
a second set of bias transistors, M13 and M14;
the two sets of bias transistors forming a bi-circuit:
wherein the M11 and M12 bias transistors are coupled to a transistor M15, which is coupled to a transistor M17;
wherein the M13 and M14 bias transistors are coupled to transistor M16, which is coupled to a transistor M18;
wherein in a stable state, the bias transistors are biased from the bias circuit and the current from the differential amplifiers do not flow into the bias transistors, the M16 M17 transistors are in the triode region and output transistors of the output stage consume no power.

2. The buffer amplifier of claim 1, wherein the differential amplifiers each comprises
a differential pair that is biased by a constant current source, and
a current mirror that actively loads the differential pair.

3. The buffer amplifier of claim 2, wherein the differential pairs of the differential amplifiers have substantially the same bias current.

4. The buffer amplifier of claim 1, wherein the second stage amplifier operates under a rail-to-rail input from the DC bias stage.

5. The buffer amplifier of claim 1, wherein currents from the differential amplifiers do not enter the second stage amplifier when the buffer amplifier is in a stable state.

6. The buffer amplifier of claim 1, wherein the output stage is coupled to a colunm line of a liquid crystal display screen.

7. The buffer amplifier of claim 1, wherein when input voltage is increased, gate voltages of transistors M15-M18 increase, thereby causing M16 to remain in the triode region an M17 to enter the saturation region.

8. The buffer amplifier of claim 7, wherein the output stage comprises a M19 and a M20 transistor, wherein a decrease in drain voltage of the M17 transistor turns on the M19 transistor, which charges an output node of the output stage;

wherein the M20 transistor is in the cut off range when the M19 transistor charges the output node.

9. The buffer amplifier of claim 8, wherein when the voltage difference between input and output is almost zero, the M19 transistor ceases charging the output node.

10. The buffer amplifier of claim 9, wherein when the input voltage decreases, the gate voltage of the M20 transistor is increased and discharges an output load until the output voltage is almost equal to the input voltage.

11. An LCD driver incorporating the buffer amplifier of claim 1.

12. An LCD incorporating the LCD driver of claim 11.

* * * * *